United States Patent
Tsunoda (10) Patent No.: US 10,999,951 B2
(45) Date of Patent: May 4, 2021

(54) ELECTRONIC DEVICE AND HOUSING UNIT FOR ELECTRONIC DEVICE

(71) Applicant: FUJITSU LIMITED, Kawasaki (JP)

(72) Inventor: Yosuke Tsunoda, Tachikawa (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/695,294

(22) Filed: Nov. 26, 2019

(65) Prior Publication Data

US 2020/0214169 A1 Jul. 2, 2020

(30) Foreign Application Priority Data

Dec. 26, 2018 (JP) .............................. JP2018-243124

(51) Int. Cl.
*H05K 7/20* (2006.01)

(52) U.S. Cl.
CPC ..... *H05K 7/20245* (2013.01); *H05K 7/20409* (2013.01); *H05K 7/203* (2013.01); *H05K 7/20236* (2013.01)

(58) Field of Classification Search
CPC .......... H05K 7/20245; H05K 7/20409; H05K 7/203; H05K 7/20781; H05K 7/20236; H05K 7/20254; H05K 7/20163
See application file for complete search history.

(56) References Cited

U.S. PATENT DOCUMENTS

| | | | |
|---|---|---|---|
| 4,949,164 A | 8/1990 | Ohashi et al. | |
| 6,570,086 B1 * | 5/2003 | Shimoji | H05K 7/20445 174/377 |
| 9,232,682 B2 * | 1/2016 | Liu | H04W 88/08 |
| 2017/0290205 A1 * | 10/2017 | Shepard | H05K 7/20936 |
| 2018/0027645 A1 * | 1/2018 | Tahara | H05K 1/02 361/707 |
| 2018/0153058 A1 | 5/2018 | Hirai et al. | |

FOREIGN PATENT DOCUMENTS

| | | |
|---|---|---|
| JP | 61-59350 U | 4/1986 |
| JP | 01-103584 | 4/1989 |
| JP | 2018-088433 | 6/2018 |

* cited by examiner

*Primary Examiner* — Mukundbhai G Patel
(74) *Attorney, Agent, or Firm* — Fujitsu Patent Center (57) ABSTRACT

An electronic device includes: a heat generating component; a board disposed in a vertical direction, the heat generating component mounted on a first surface of the board; a first thermally conductive member superposed on a second surface of the board opposite the first surface of the board; a plurality of second thermally conductive members extending in a horizontal direction from a first surface of the first thermally conductive member; a third thermally conductive member facing the first surface of the board, the third thermally conductive member secured to the distal end portions of the plurality of second thermally conductive members; a housing including a first wall portion superposed on a second surface of the first thermally conductive member, and a second wall portion opposite the first wall portion; and a heat sink provided on an outer surface of the second wall portion.

4 Claims, 12 Drawing Sheets

ELECTRONIC DEVICE AND HOUSING UNIT FOR ELECTRONIC DEVICE

CROSS-REFERENCE TO RELATED APPLICATION

This application is based upon and claims the benefit of priority of the prior Japanese Patent Application No. 2018-243124, filed on Dec. 26, 2018, the entire contents of which are incorporated herein by reference.

FIELD

The embodiments discussed herein are related to an electronic device and a housing unit for an electronic device.

BACKGROUND

Some electronic devices include a heat generating component, a board on which the heat generating component is mounted, a housing which houses the heat generating component and the board, and a heat sink provided on an outer surface of the housing (see, for example, PTL 1). In this electronic device, heat is transmitted from the heat generating component to the heat sink with convection of a fluid filled in the housing, thereby the heat generating component is cooled.

Examples of the related art include Japanese Laid-open Patent Publication No. 2018-088433, Japanese Laid-open Utility Model Publication No. 61-059350, and Japanese Laid-open Patent Publication No. 1-103854.

SUMMARY

According to an aspect of the embodiments, an electronic device includes: a heat generating component; a board disposed in a vertical direction, the heat generating component mounted on a first surface of the board; a first thermally conductive member superposed on a second surface of the board opposite the first surface of the board; a plurality of second thermally conductive members extending in a horizontal direction from a first surface of the first thermally conductive member, the plurality of second thermally conductive members having respective distal end portions positioned on a side opposite the board relative to the heat generating component; a third thermally conductive member facing the first surface of the board, the third thermally conductive member secured to the distal end portions of the plurality of second thermally conductive members; a housing including a first wall portion superposed on a second surface of the first thermally conductive member, and a second wall portion opposite the first wall portion, the housing the heat generating component, the board, the first thermally conductive member, the plurality of second thermally conductive members, and the third thermally conductive member; and a heat sink provided on an outer surface of the second wall portion.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENT(S)

When, for cooling the heat generating component, heat is transmitted from the heat generating component to the heat sink with convection of the fluid filled in the housing, it is desired that turbulence in the convection be suppressed so as to facilitate the convection, thereby improving cooling efficiency for the heat generating component.

An object of the technique disclose herein is, in an aspect, to suppress turbulence in convection to facilitate the convection, thereby improving cooling efficiency for a heat generating component.

With the technique disclose herein, the turbulence in the convection is suppressed to facilitate the convection, thereby the cooling efficiency for the heat generating component may be improved.

First Embodiment

First, a first embodiment of the technique disclosed herein is described.

Figure 1:
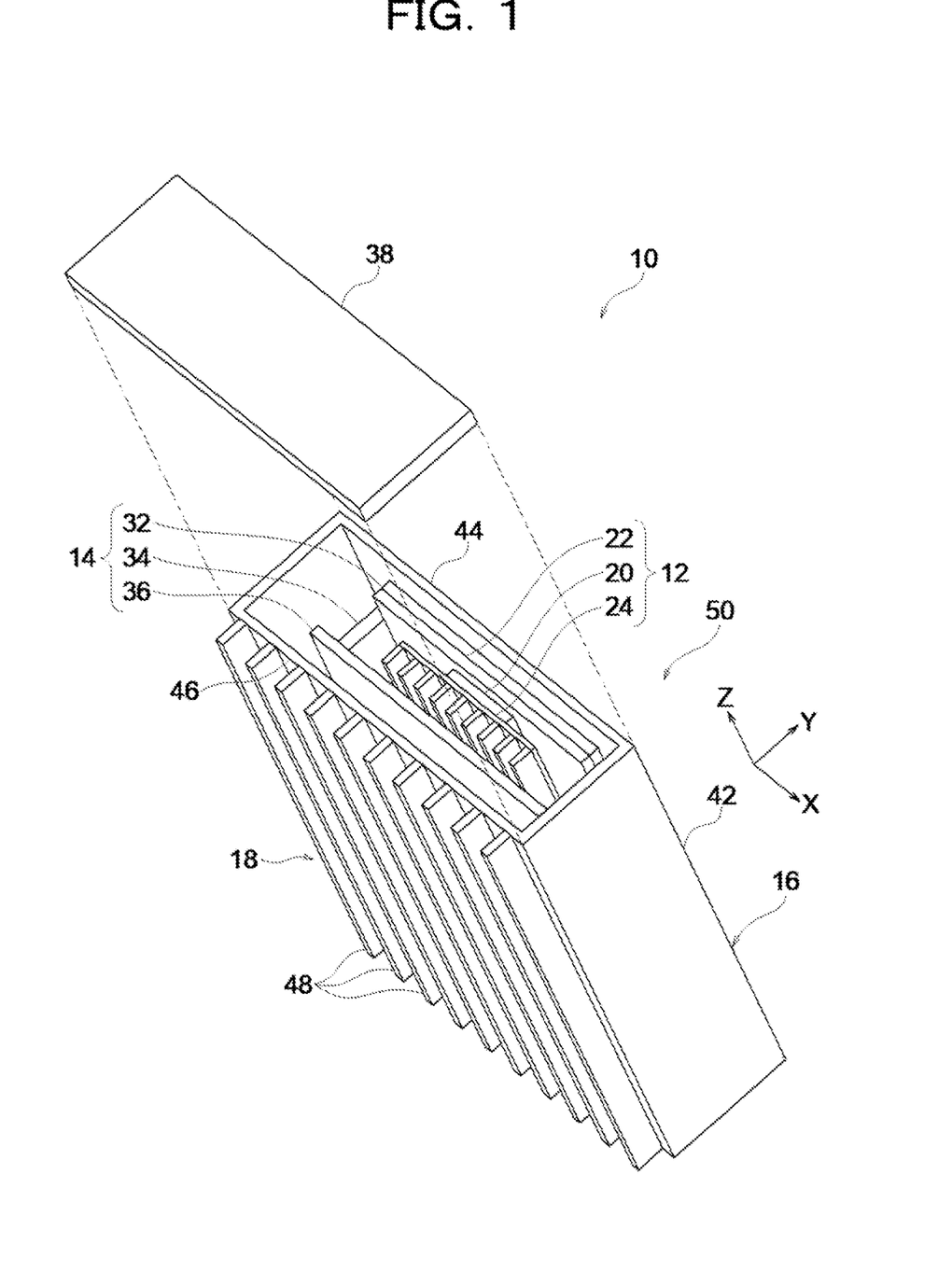
FIG. 1 is a perspective view of an electronic device according to a first embodiment.
Figure 2:
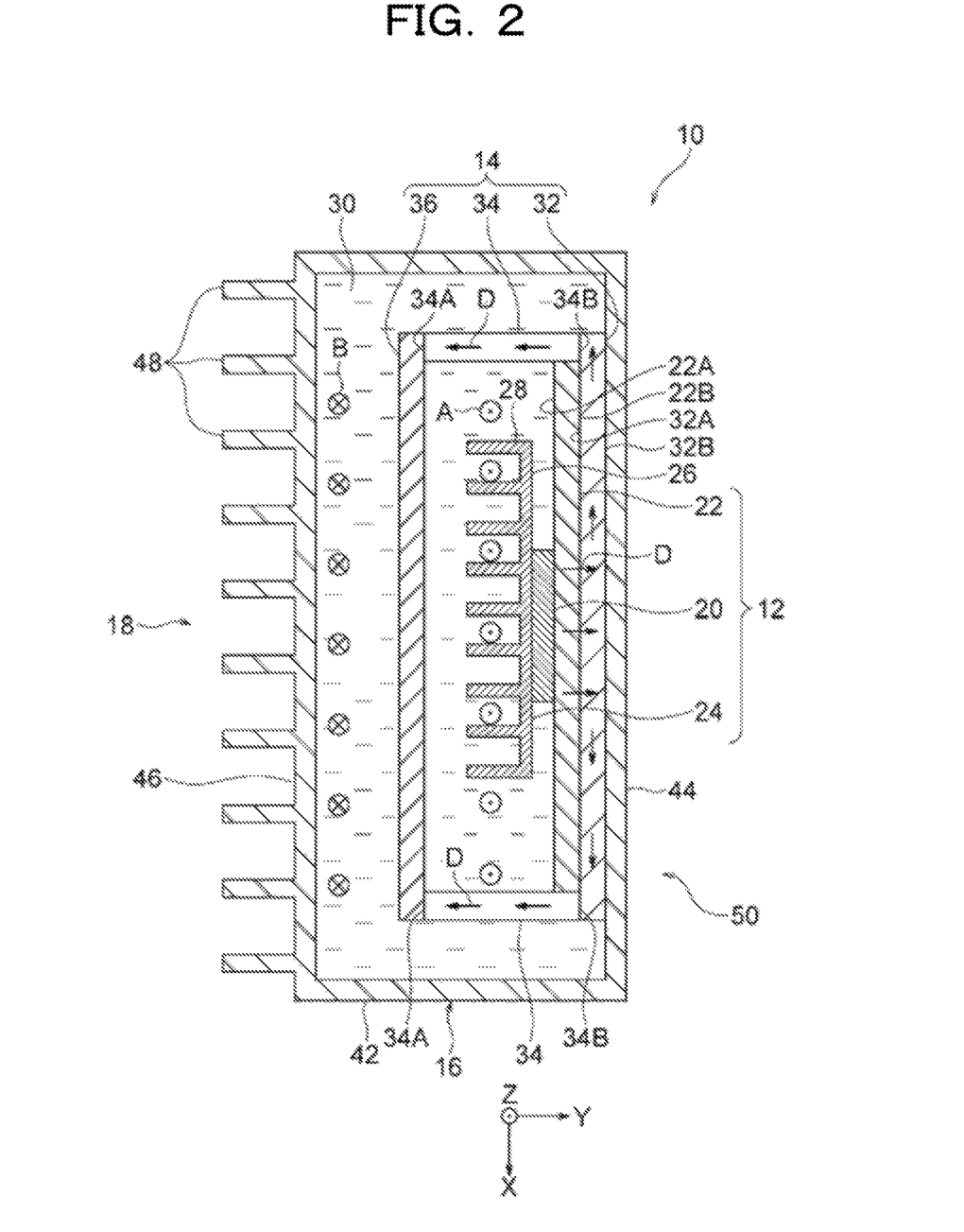
FIG. 2 is a cross sectional view of the electronic device illustrated in FIG. 1.
Figure 3:
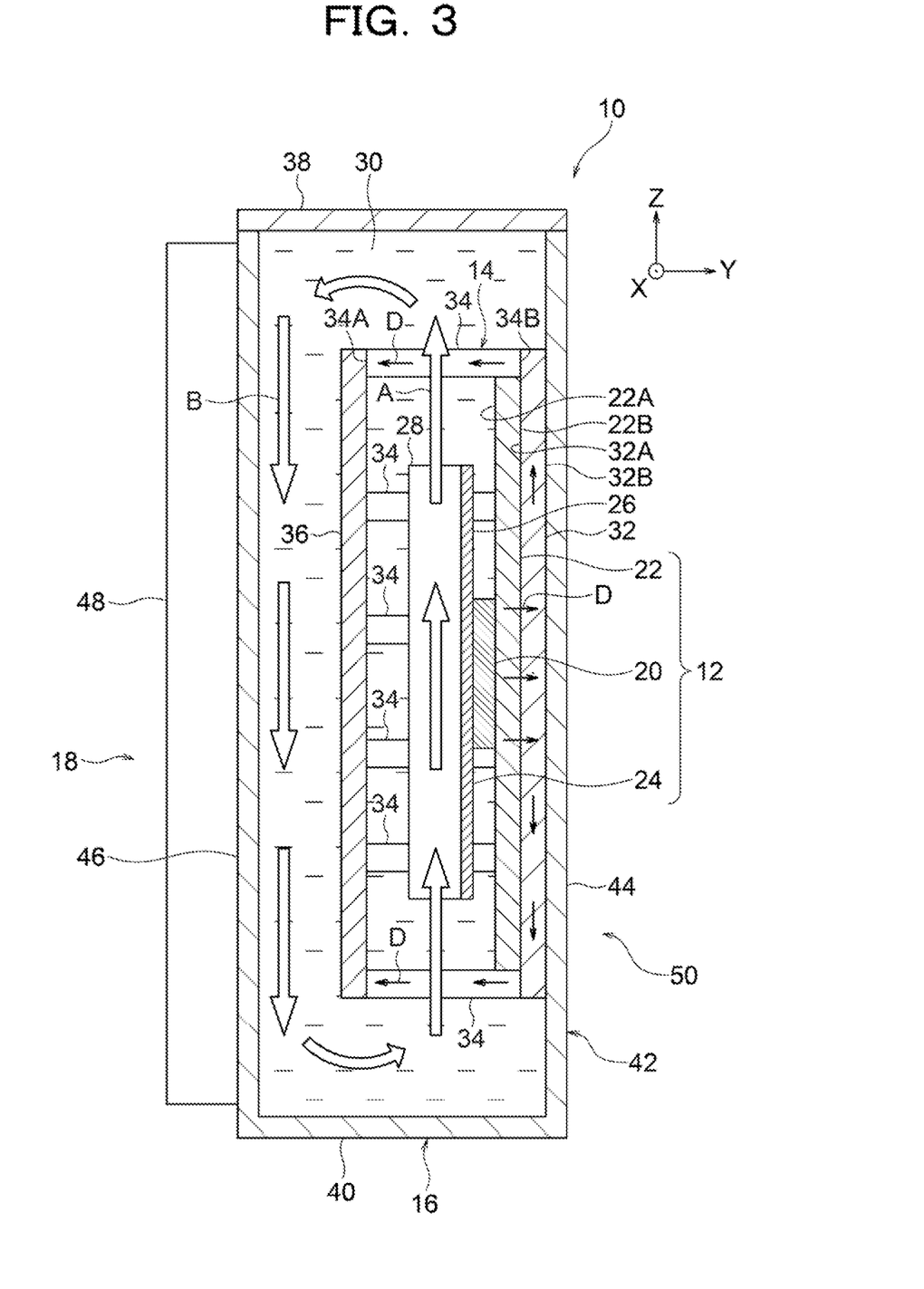
FIG. 3 is a longitudinal sectional view of the electronic device illustrated in FIG. 1.

As illustrated in FIGS. 1 to 3, an electronic device 10 according to the first embodiment includes a board unit 12, a thermal conduction mechanism 14, a housing 16, and a first heat sink 18.

In each of the drawings, an arrow X indicates the width direction of the electronic device 10, an arrow Y indicates the depth direction of the electronic device 10, and an arrow Z indicates the height direction of the electronic device 10. The electronic device 10 is used with the height direction aligned with the vertical direction. Hereinafter, the structures of members of the electronic device 10 are described based on the configuration in which the electronic device 10 is arranged with the height direction aligned with the vertical direction.

The board unit 12 includes a heat generating component 20, a board 22, and a second heat sink 24. The board 22 has a flat plate shape and is disposed in the vertical direction. The board 22 has a first surface 22A and a second surface 22B opposite the first surface 22A. A heat generating component 20 is mounted on the first surface 22A of the board 22. The heat generating component 20 is, for example, an electronic component having a heat generating property such as a central processing unit (CPU).

The second heat sink 24 is disposed on the opposite side to the board 22 relative to the heat generating component 20. The second heat sink 24 includes a plate-shaped portion 26 and a plurality of fins 28. The plate-shaped portion 26 is in contact with and superposed on the heat generating component 20. The plate-shaped portion 26 may be superposed on the heat generating component 20 directly or through a thermally conductive sheet or the like. The fins 28 extend in the horizontal direction from the plate-shaped portion 26 toward the opposite side to the heat generating component 20.

The thermal conduction mechanism 14 includes a first thermally conductive member 32, a plurality of second thermally conductive members 34, and a third thermally conductive member 36. The first thermally conductive member 32, the second thermally conductive members 34, and the third thermally conductive member 36 are formed of, for example, metal and have thermal conductivity.

The first thermally conductive member 32 has a flat plate shape and is disposed in the vertical direction. The first thermally conductive member 32 is superposed on the second surface 22B of the board 22. The first thermally conductive member 32 is thermally coupled to the heat generating component 20 through the board 22. The term "thermally coupled" corresponds to coupling through a member having thermal conductivity such that heat is able to be transferred. The first thermally conductive member 32 may be superposed on the board 22 directly or through a thermally conductive sheet or the like.

The second thermally conductive members 34 have, for example, a columnar shape and extend in the horizontal direction from a first surface 32A of the first thermally conductive member 32. The first surface 32A of the first thermally conductive member 32 is superposed on the board 22. The second thermally conductive members 34 are disposed so as to be spaced from one another in the peripheral direction of an outer peripheral portion of the first thermally conductive member 32 having a quadrangular shape in plan view. A distal end portion 34A of each of the second thermally conductive members 34 is positioned on the opposite side to the board 22 relative to the heat generating component 20 and the second heat sink 24. A proximal end portion 34B of each of the second thermally conductive members 34 is secured to the outer peripheral portion of the first surface 32A of the first thermally conductive member 32. The second thermally conductive members 34 may be heat pipes.

The third thermally conductive member 36 has a flat plate shape and is disposed in the vertical direction. The third thermally conductive member 36 faces the first surface 22A of the board 22 in the horizontal direction and is secured to the distal end portions 34A of the second thermally conductive members 34. The distal end portions 34A of the second thermally conductive members 34, to which the third thermally conductive member 36 is secured, are not limited to distal end surfaces of the second thermally conductive members 34. The distal end portions 34A may be any portions on the distal end sides of the second thermally conductive members 34. The third thermally conductive member 36 is thermally coupled to the first thermally conductive member 32 through the second thermally conductive members 34.

The housing 16 houses the heat generating component 20, the board 22, the first thermally conductive member 32, the second thermally conductive members 34, and the third thermally conductive member 36 having been described. The housing 16 is filled with a liquid 30 having an insulating property. The liquid 30 is, for example, a fluorine-based inert liquid or oil. When the housing 16 is filled with the liquid 30, the board unit 12 including the heat generating component 20 and the second heat sink 24 is immersed.

The housing 16 is, for example, formed of metal and includes a top wall portion 38, a bottom wall portion 40, and a peripheral wall portion 42 coupling the top wall portion 38 and the bottom wall portion 40 to each other. The top wall portion 38 is a detachable lid member. In FIG. 1, the top wall portion 38 is detached. In FIG. 3, the top wall portion 38 is attached. Gaps are reliably set between the third thermally conductive member 36 and the top wall portion 38 in the vertical direction and between the third thermally conductive member 36 and the bottom wall portion 40 in the vertical direction.

The peripheral wall portion 42 of the housing 16 includes a first wall portion 44 and a second wall portion 46, which extend in the vertical direction. A second surface 32B of the first thermally conductive member 32 is superposed on the first wall portion 44. The second wall portion 46 is positioned on the opposite side to the first wall portion 44. The second wall portion 46, which is positioned on the opposite side to the board 22 relative to the third thermally conductive member 36, faces the third thermally conductive member 36 in the horizontal direction.

The first heat sink 18 is an example of a "heat sink" and includes a plurality of fins 48. The first heat sink 18 is provided on an outer surface of the second wall portion 46. The first heat sink 18, which is provided on the second wall portion 46, is thermally coupled to the second wall portion 46. The first heat sink 18 may be formed integrally with or independently of the second wall portion 46.

In the electronic device 10, the first thermally conductive member 32, the second thermally conductive members 34, the third thermally conductive member 36, the housing 16, and the first heat sink 18 form a housing unit 50.

Next, operations and effects according to the first embodiment are described.

Figure 11:
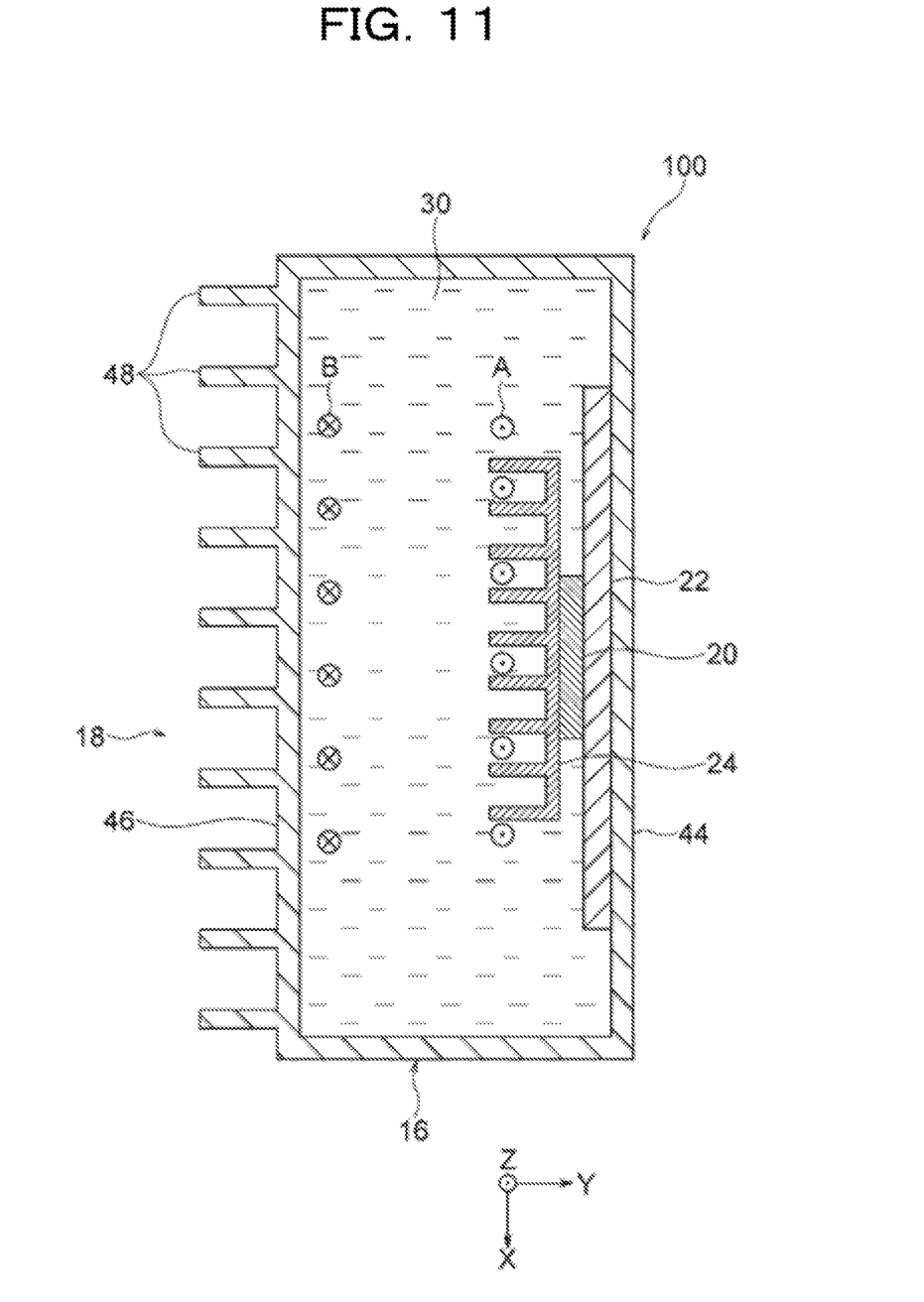
FIG. 11 is a cross sectional view of an electronic device according to a comparative example.
Figure 12:
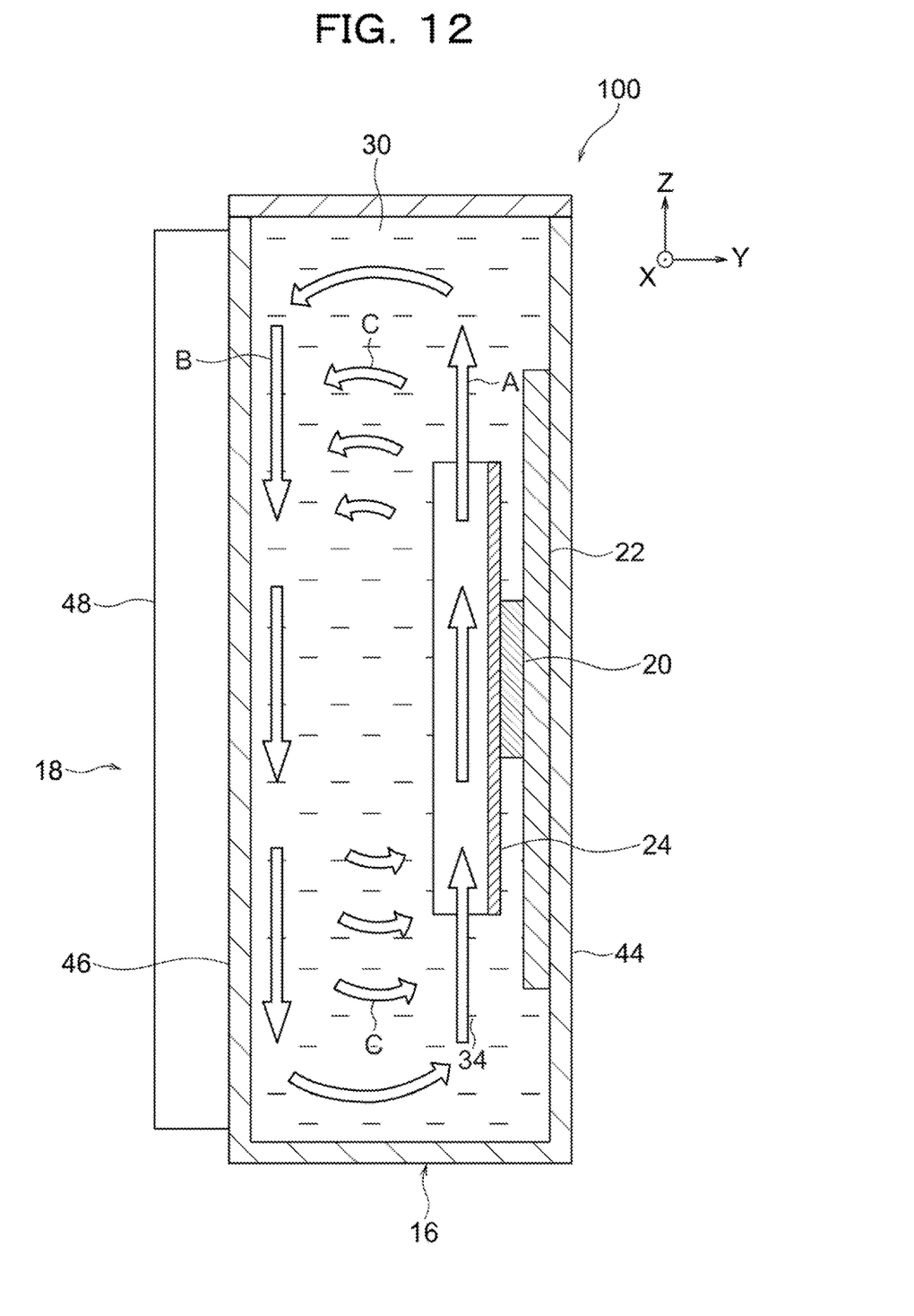
FIG. 12 is a longitudinal sectional view of the electronic device illustrated in FIG. 11.

First, a comparative example is described to clarify the operations and effects according to the first embodiment. FIG. 11 and FIG. 12 illustrate an electronic device 100 according to a comparative example. The thermal conduction mechanism 14 of the electronic device 10 according to the first embodiment (see FIGS. 1 to 3) is omitted from the electronic device 100 according to the comparative example.

In the electronic device 100 according to the comparative example, when the heat generating component 20 generates heat, the liquid 30 is heated by the second heat sink 24 and the heat generating component 20 provided on the board 22. Thus, a flow A directed upward along the board 22 is generated in the liquid 30. In contrast, when the liquid 30 is cooled by the second wall portion 46 provided with the first heat sink 18, a flow B directed downward along the second wall portion 46 is generated in the liquid 30.

However, as illustrated in FIG. 12, in the electronic device 100 according to the comparative example, the board 22 faces the second wall portion 46. Thus, the flow A directed upward along the board 22 and the flow B directed downward along the second wall portion 46 flow through a common region. Accordingly, when convection of the liquid 30 occurs between the board 22 and the second wall portion 46, turbulence C is generated in the convection. This may reduce cooling efficiency for the heat generating component 20 due to obstruction of the flows A and B forming the convection.

In contrast, as illustrated in FIG. 3, in the electronic device 10 according to the first embodiment, when the heat generating component 20 generates heat, the heat of the heat generating component 20 is transmitted, as indicated by arrows D, to the third thermally conductive member 36 through the board 22, the first thermally conductive member 32, and the second thermally conductive members 34. When the liquid 30 is heated by the heat generating component 20, the second heat sink 24, and the third thermally conductive member 36, the flow A directed upward along the board 22 is generated in the liquid 30. Furthermore, when the liquid 30 is cooled by the second wall portion 46 provided with the first heat sink 18, the flow B directed downward along the second wall portion 46 is generated in the liquid 30.

Here, the third thermally conductive member 36 is positioned between the flow A directed upward along the board 22 and the flow B directed downward along the second wall portion 46. Accordingly, since the third thermally conductive member 36 functions as a partition wall, the flow A directed upward and the flow B directed downward flow through separate regions. This suppresses generation of the turbulence in the convection. As a result, the convection is facilitated, thereby the cooling efficiency for the heat generating component 20 may be improved.

Furthermore, the third thermally conductive member 36 not only functions as the partition wall but also is thermally coupled to the heat generating component 20 through the first thermally conductive member 32 and the second thermally conductive members 34. Thus, the flow A directed upward may be facilitated as the third thermally conductive member 36 exchanges the heat with the liquid 30. Accordingly, the convection may be further facilitated.

Next, variants of the first embodiment are described.

Figure 4:
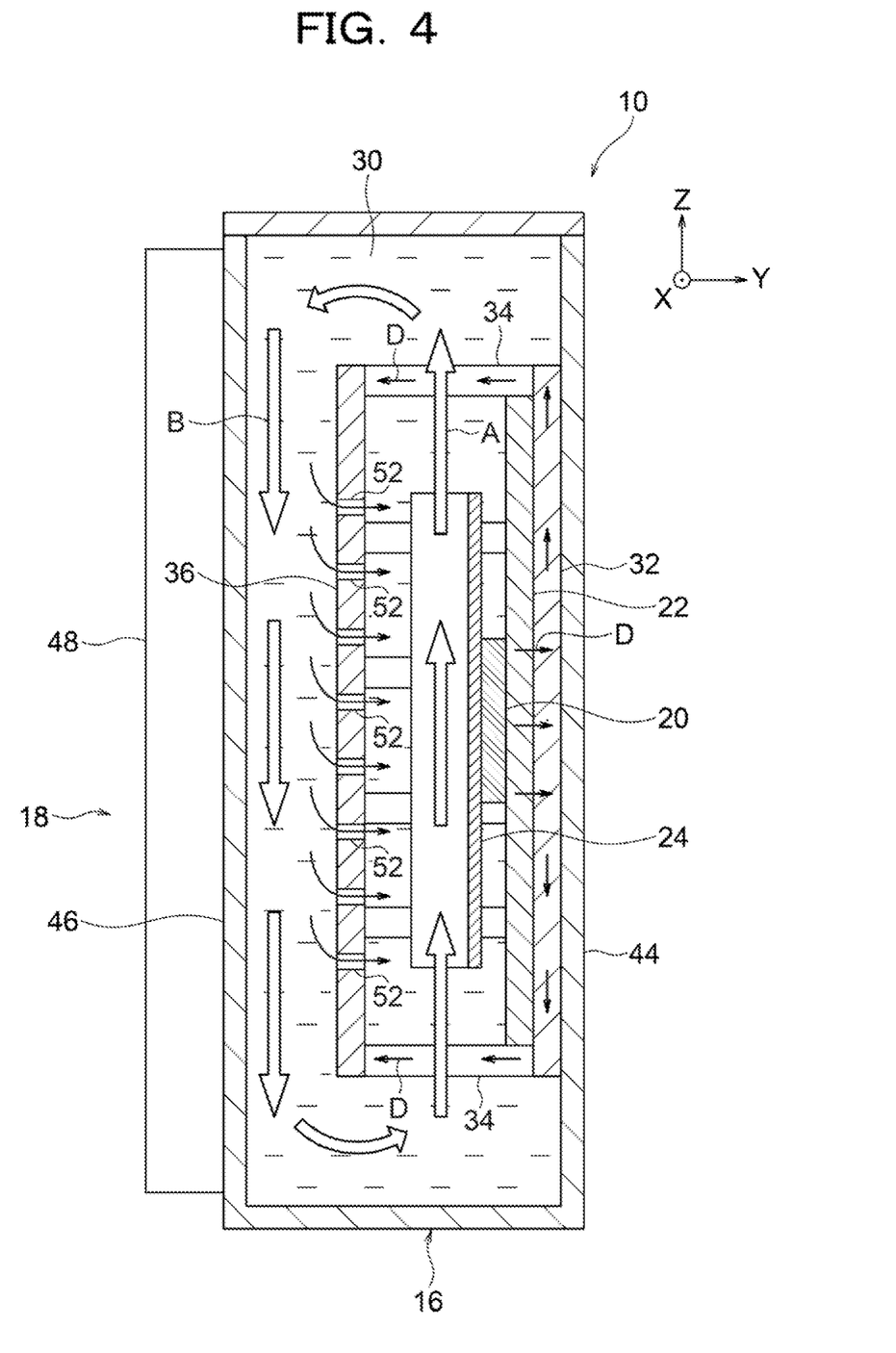
FIG. 4 is a longitudinal sectional view illustrating a first variant of the electronic device illustrated in FIG. 1.

As illustrated in FIG. 4, according to the first embodiment, a plurality of holes 52 that penetrate through the third thermally conductive member 36 in the horizontal direction may be formed. With such a structure, part of the flow B directed downward along the second wall portion 46 is supplied to the heat generating component 20 and the second heat sink 24 through the holes 52. Thus, the cooling efficiency for the heat generating component 20 may be further improved.

Figure 5:
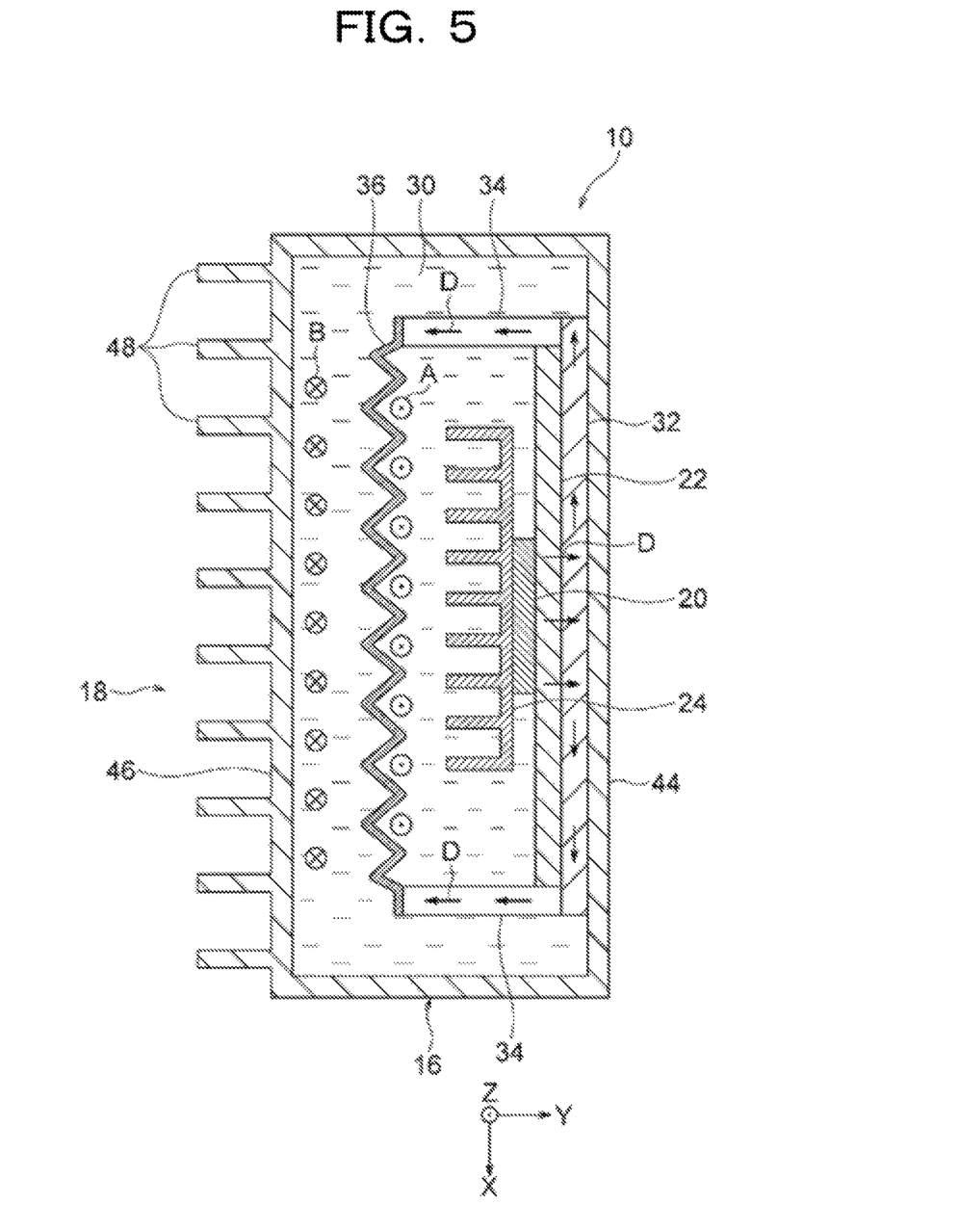
FIG. 5 is a cross sectional view rating a second variant of the electronic device illustrated in FIG. 1.

As illustrated in FIG. 5, according to the first embodiment, the third thermally conductive member 36 may have a wave shape in top view. With such a structure, the flow A directed upward along the third thermally conductive member 36 may be rectified by irregularities formed in the third thermally conductive member 36. Thus, the convection may be further facilitated. Furthermore, the surface area of the third thermally conductive member 36 is increased compared to the case where the third thermally conductive member 36 has a flat plate shape. Accordingly, heat exchange efficiency between the liquid 30 and the third thermally conductive member 36 may be improved. Thus, the cooling efficiency for the heat generating component 20 may be further improved.

Although the housing 16 is filled with the liquid 30 according to the first embodiment, the housing 16 may be filled with gas instead of the liquid 30. Heat may be transmitted from the heat generating component 20 to the first heat sink 18 with convection of the gas so as to cool the heat generating component 20.

Although the second heat sink 24 is used according to the first embodiment, the second heat sink 24 may be omitted.

A plurality of the variants of the first embodiment ay be combined with one another.

Second Embodiment

Next, a second embodiment of the technique disclosed herein is described.

Figure 6:
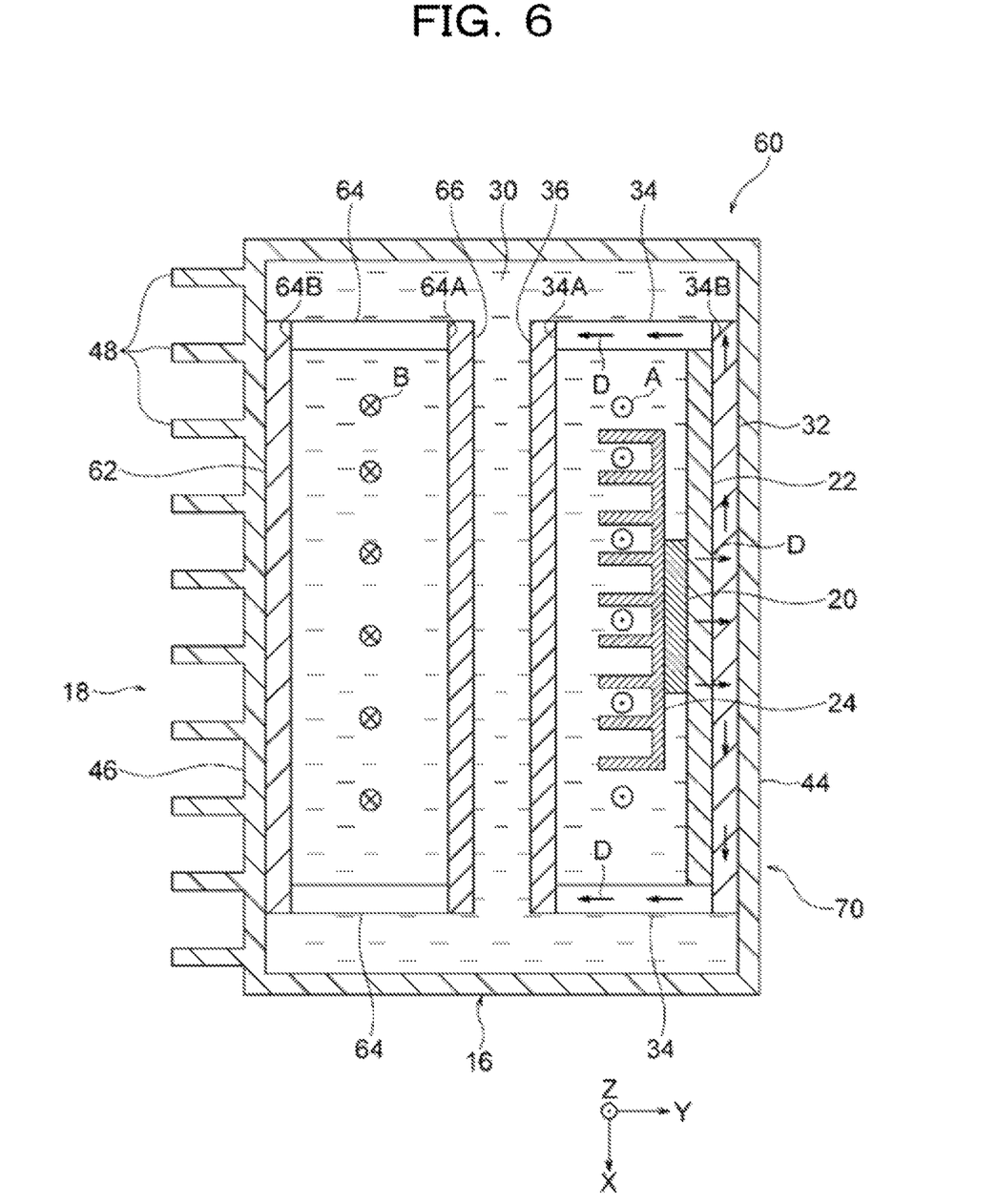
FIG. 6 is a cross sectional view of an electronic device according to a second embodiment.
Figure 7:
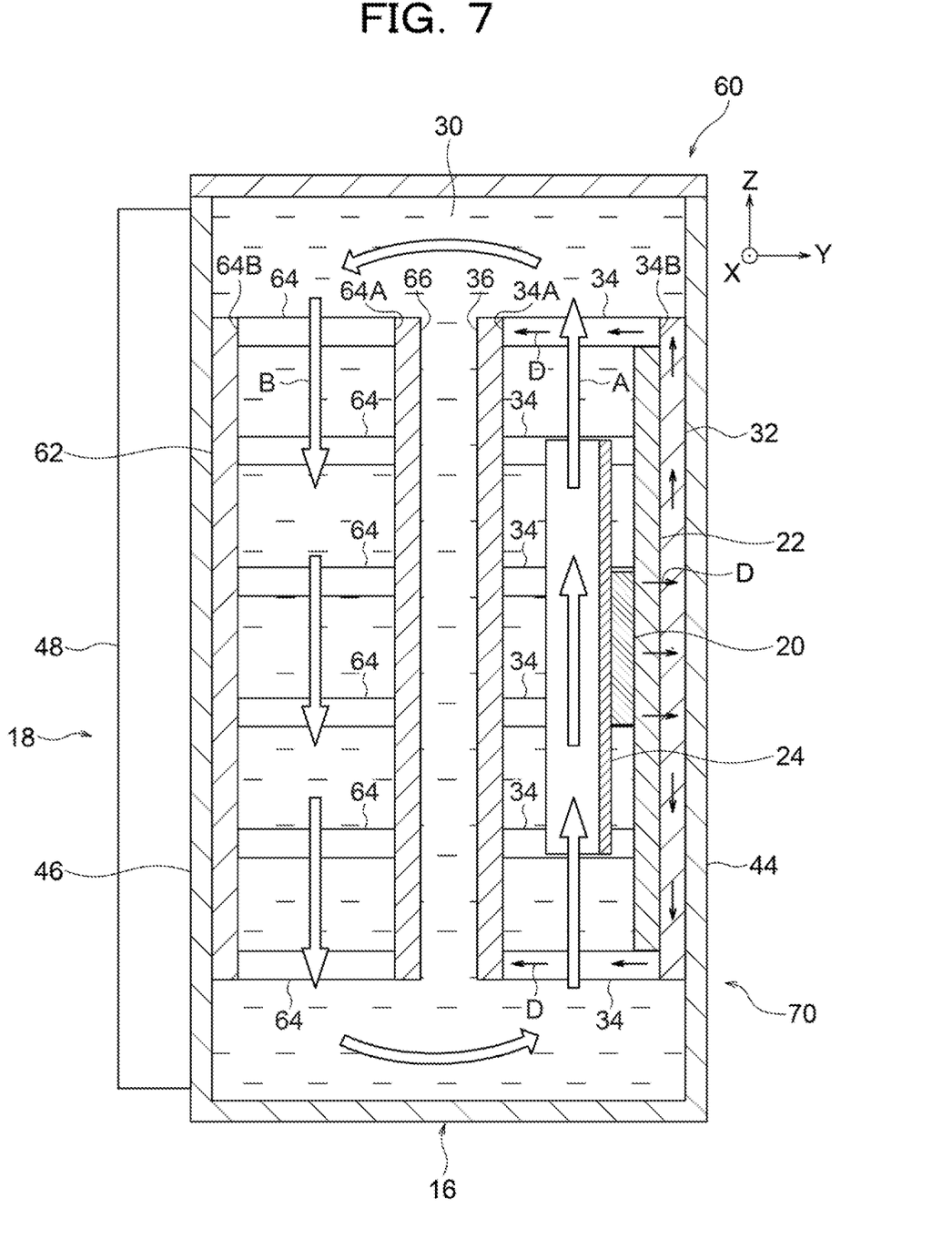
FIG. 7 is a longitudinal sectional view of the electronic device illustrated in FIG. 6.

The structure of an electronic device 60 according to the second embodiment illustrated in FIGS. 6 and 7 is changed from the structure of the electronic device 10 according to the first embodiment (see FIGS. 1 to 3) as follows.

That is, the electronic device 60 according to the second embodiment includes a fourth thermally conductive member 62, a plurality of fifth thermally conductive members 64, and a sixth thermally conductive member 66. The fourth thermally conductive member 62, the fifth thermally conductive members 64, and the sixth thermally conductive member 66 are housed in the housing 16.

The fourth thermally conductive member 62 has a flat plate shape and is disposed in the vertical direction. The fourth thermally conductive member 62 is superposed on the second wall portion 46 from the inside of the housing 16. The fourth thermally conductive member 62 is thermally coupled to the second heat sink 24 through the second wall portion 46. The fourth thermally conductive member 62 may be superposed on the second wall portion 46 directly or through a thermally conductive sheet or the like.

The fifth thermally conductive members 64 have, for example, a columnar shape and extend in the horizontal direction from the fourth thermally conductive member 62 toward the third thermally conductive member 36. The fifth thermally conductive members 64 are disposed so as to be spaced from one another in the peripheral direction of an outer peripheral portion of the fourth thermally conductive member 62 having a quadrangular shape in plan view. A proximal end portion 64B of each of the fifth thermally conductive member 64 is secured to the outer peripheral portion of the fourth thermally conductive member 62. The fifth thermally conductive members 64 may be heat pipes.

The sixth thermally conductive member 66 has a flat plate shape and is disposed in the vertical direction. The sixth thermally conductive member 66 faces the third thermally conductive member 36 in the horizontal direction and is secured to distal end portions 64A of the respective fifth thermally conductive members 64. The distal end portions 64A of the fifth thermally conductive members 64, to which the sixth thermally conductive member 66 is secured, are not limited to distal end surfaces of the fifth thermally conductive members 64. The distal end portions 64A may be any portions on the distal end sides of the fifth thermally conductive members 64. The sixth thermally conductive member 66 is thermally coupled to the fourth thermally conductive member 62 through the fifth thermally conductive members 64. Gaps are reliably set between the sixth thermally conductive member 66 and the top wall portion 38 in the vertical direction and between the sixth thermally conductive member 66 and the bottom wall portion 40 in the vertical direction.

In the electronic device 60, the first thermally conductive member 32, the second thermally conductive members 34, the third thermally conductive member 36, the housing 16, the first heat sink 18, the fourth thermally conductive member 62, the fifth thermally conductive members 64, and the sixth thermally conductive member 66 form a housing unit 70.

Next, operations and effects according to the second embodiment are described.

In the electronic device 60 according to the second embodiment, when the heat generating component 20 generates heat, the heat of the heat generating component 20 is transmitted, as indicated by the arrows D, to the third thermally conductive member 36 through the board 22, the first thermally conductive member 32, and the second thermally conductive members 34. By heating the liquid 30 by the heat generating component 20, the second heat sink 24, and the third thermally conductive member 36, the flow A directed upward along the board 22 is generated in the liquid 30. Furthermore, when the liquid 30 is cooled by the fourth thermally conductive member 62 and the sixth thermally conductive member 66 thermally coupled to the first heat sink 18, the flow B directed downward along the fourth thermally conductive member 62 is generated in the liquid 30.

Here, the third thermally conductive member 36 and the sixth thermally conductive member 66 are positioned between the flow A directed upward along the board 22 and the flow B directed downward along the fourth thermally conductive member 62. Accordingly, since the third thermally conductive member 36 and the sixth thermally conductive member 66 function as partition walls, the flow A directed upward and the flow B directed downward flow through separate regions. This suppresses generation of turbulence in convection. As a result, the convection is facilitated, thereby the cooling efficiency for the heat generating component 20 may be improved.

Furthermore, the third thermally conductive member 36 not only functions as the partition wall but also is thermally coupled to the heat generating component 20 through the first thermally conductive member 32 and the second thermally conductive members 34. Thus, the flow A directed upward may be facilitated as the third thermally conductive member 36 exchanges the heat with the liquid 30. Likewise, the sixth thermally conductive member 66 not only functions as the partition wall but also is thermally coupled to the first heat sink 18 through the fourth thermally conductive member 62 and the fifth thermally conductive members 64. Thus, the flow B directed downward may be facilitated as the sixth thermally conductive member 66 exchanges the heat with the liquid 30. Thus, the convection may be further facilitated.

Next, variants of the second embodiment are described.

Figure 8:
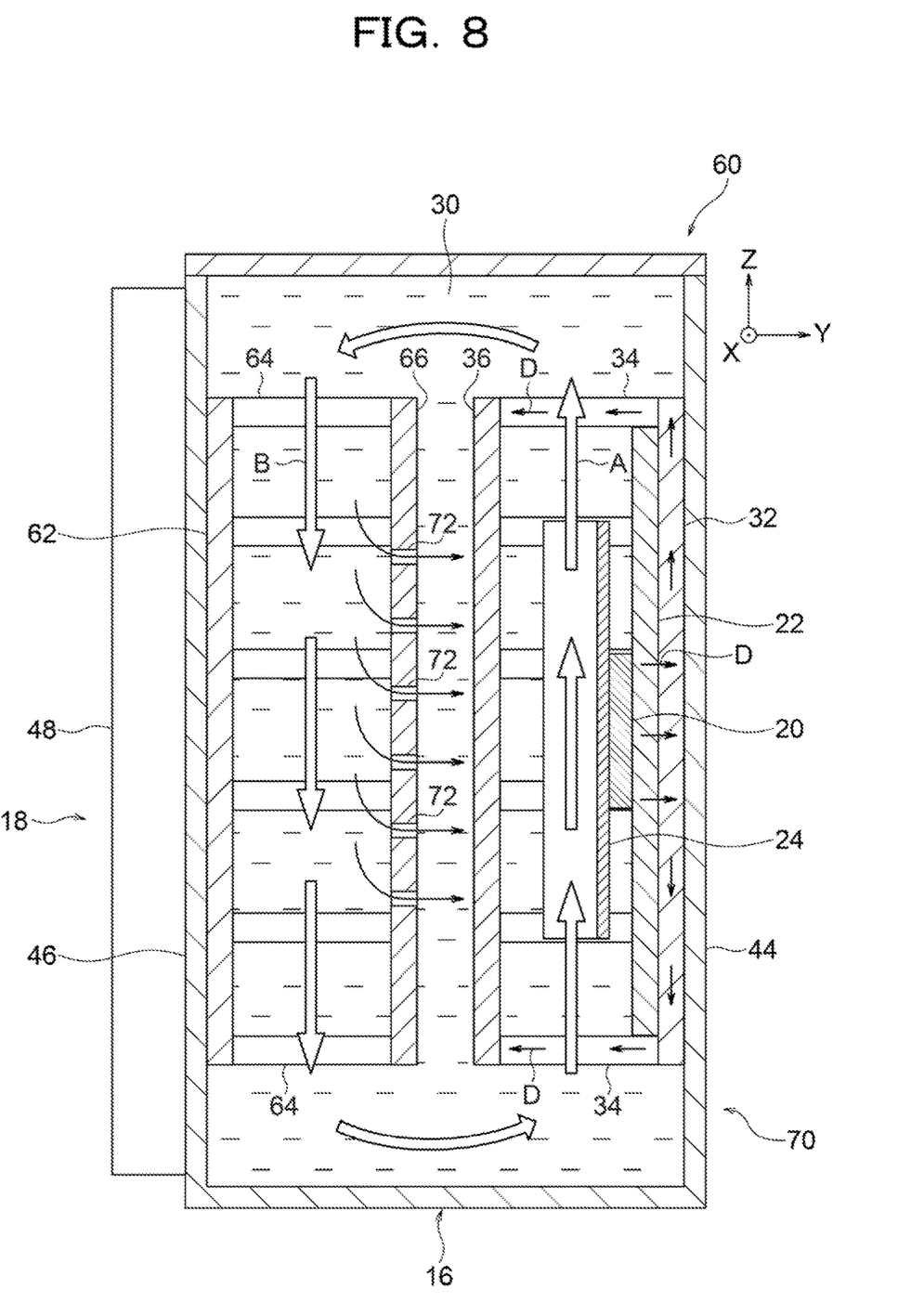
FIG. 8 is a longitudinal sectional view illustrating a first variant of the electronic device illustrated in FIG. 6.

As illustrated in FIG. 8, according to the second embodiment, a plurality of holes 72 that penetrate through the sixth thermally conductive member 66 in the horizontal direction may be formed. With such a structure, part of the flow B directed downward along the fourth thermally conductive member 62 is supplied to the third thermally conductive member 36 through the holes 72. Thus, the cooling efficiency for the heat generating component 20 thermally coupled to the third thermally conductive member 36 may be further improved.

Figure 9:
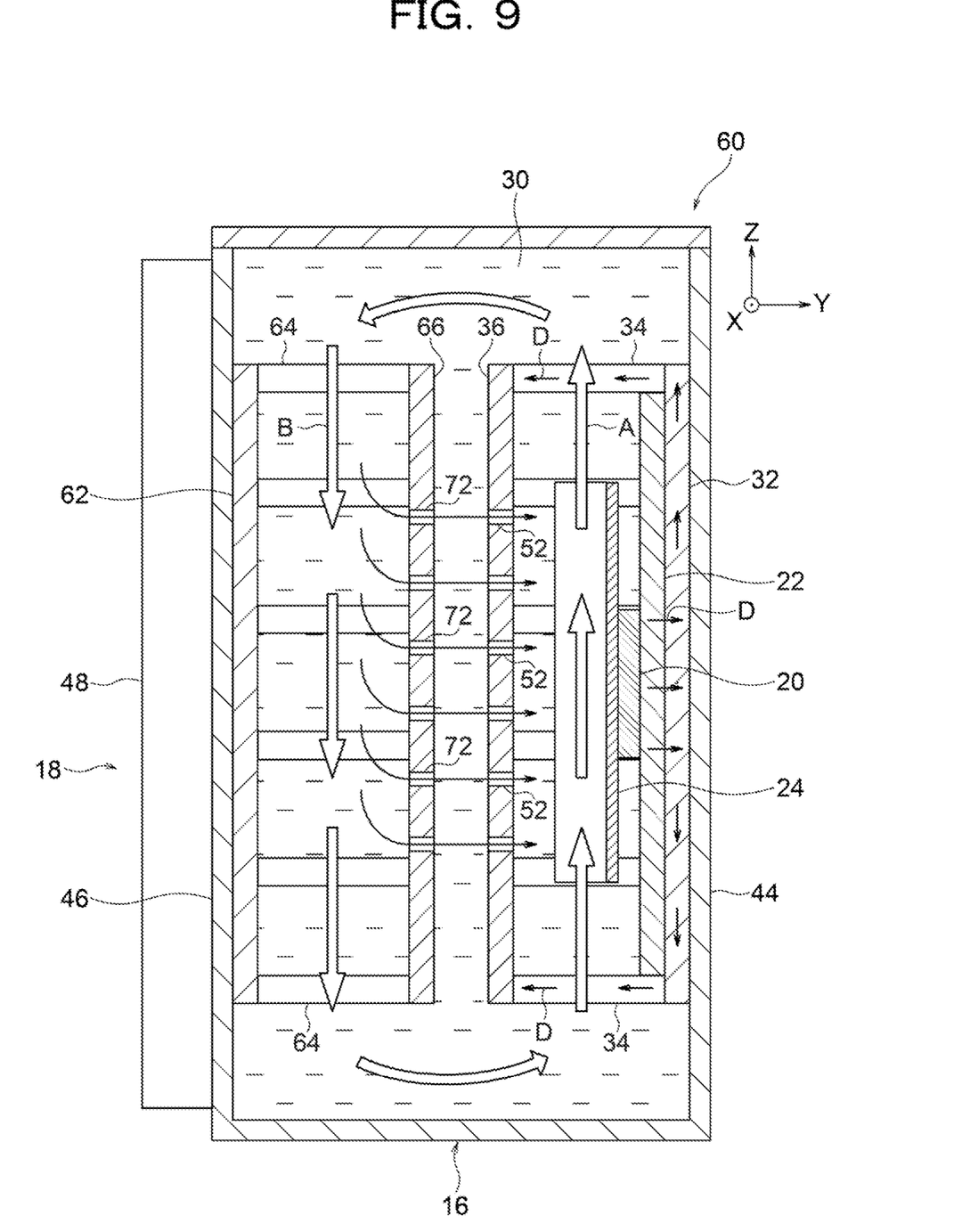
FIG. 9 is a longitudinal sectional view illustrating a second variant of the electronic device illustrated in FIG. 6.

As illustrated in FIG. 9, the holes 52 that penetrate through the third thermally conductive member 36 in the horizontal direction may be formed in addition to the holes 72 that penetrate through the sixth thermally conductive member 66 in the horizontal direction. With such a structure, part of the flow B directed downward along the fourth thermally conductive member 62 is supplied to the heat generating component 20 and the second heat sink 24 through the holes 72 and the holes 52. Thus, the cooling efficiency for the heat generating component 20 may be further improved.

Figure 10:
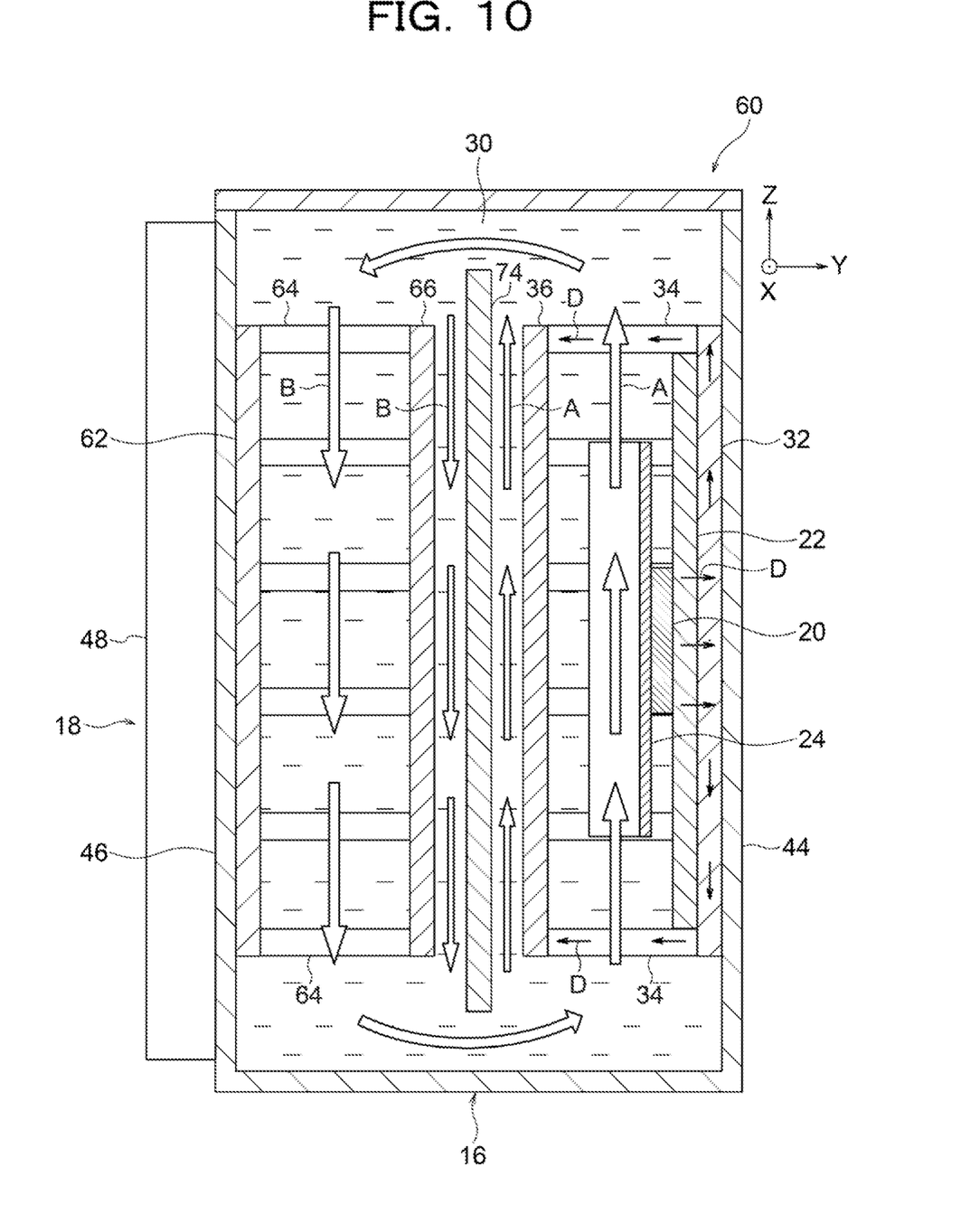
FIG. 10 is a longitudinal sectional view illustrating a third variant of the electronic device illustrated in FIG. 6.

As illustrated in FIG. 10, according to the second embodiment, when the flow A directed upward and the flow B directed downward are generated in the liquid 30 between the third thermally conductive member 36 and the sixth thermally conductive member 66, the following structure may be used.

That is, a partition wall 74 extending in the vertical direction may be disposed between the third thermally conductive member 36 and the sixth thermally conductive member 66. Such a structure may suppress interference between the flow A directed upward and the flow B directed downward between the third thermally conductive member 36 and the sixth thermally conductive member 66. Thus, the convection may be further facilitated.

A plurality of the variants of the second embodiment may be combined with one another.

Also, the variants of the first embodiment may be applied to the second embodiment (including the variants).

Although the first and second embodiments of the technique disclosed herein have been described, the technique disclosed herein is not limited to the above description. Of course, in addition to the above description, the technique disclosed herein is able to be varied in a variety of manners and embodied without departing from the gist thereof.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A liquid immersion cooling apparatus comprising:
a first housing configured to accommodate a cooling liquid and an electronic device, the electronic device including:
a heat generating component configured to be immersion-cooled in the cooling liquid;
a board disposed in a vertical direction, the heat generating component mounted on a first surface of the board; and
a second housing configured to accommodate the heat generating component and the board, the second housing being formed by a plurality of thermally conductive members so as to include a first opening as an outlet of the cooling liquid and a second opening as an inlet of the cooling liquid, the first opening being placed at an upper portion in the vertical direction with respect to the heat generating component, the second opening being place at a lower portion in the vertical direction with respect to the heat generating component, any one of the plurality of thermally conductive members being coupled to the first housing,
the plurality of thermally conductive members include:
a first thermally conductive member superposed on a second surface of the board opposite the first surface of the board;
a plurality of second thermally conductive members extending in a horizontal direction from a first surface of the first thermally conductive member, the plurality of second thermally conductive members having respective distal end portions positioned on a side opposite the board relative to the heat generating component; and
a third thermally conductive member facing the first surface of the board, the third thermally conductive member secured to the distal end portions of the plurality of second thermally conductive members.

2. The electronic device according to claim 1, wherein the first housing includes:

a first wall portion superposed on a second surface of the first thermally conductive member;

a second wall portion opposite the first wall portion; and a heat sink provided on an outer surface of the second wall portion, the electronic device further comprising:

a fourth thermally conductive member superposed on the second wall portion from inside of the first housing;

a plurality of fifth thermally conductive members that extend in the horizontal direction from the fourth thermally conductive member toward the third thermally conductive member; and a sixth thermally conductive member that is secured to distal end portions of the plurality of fifth thermally conductive members and that faces the third thermally conductive member.

3. The electronic device according to claim 1, further comprising:

a first heat sink provided on an outer surface of the first housing; and a second heat sink in contact with the heat generating component, wherein the distal end portions of the plurality of second thermally conductive members are positioned on a side opposite the board relative to the heat generating component and the second heat sink.

4. A housing unit for a liquid immersion cooling apparatus, the housing unit comprising:

a first housing; and a second housing, the first housing being configured to accommodate a cooling liquid and the second housing, the second housing being configured to accommodate a heat generating component mounted on a first surface of a board, the heat generating component being configured to be immersion-cooled in the cooling liquid, the second housing being formed by a plurality of thermally conductive members so as to include a first opening as an outlet of the cooling liquid and a second opening as an inlet of the cooling liquid, the first opening being placed at an upper portion in the vertical direction with respect to the heat generating component, the second opening being place at a lower portion in the vertical direction with respect to the heat generating component, any one of the plurality of thermally conductive members being coupled to the first housing, the plurality of thermally conductive members include:

a first thermally conductive member superposed on a second surface of the board opposite the first surface of the board;

a plurality of second thermally conductive members extending in a horizontal direction from a first surface of the first thermally conductive member, the plurality of second thermally conductive members having respective distal end portions positioned on a side opposite the board relative to the heat generating component;

a third thermally conductive member facing the first surface of the board, the third thermally conductive member secured to the distal end portions of the plurality of second thermally conductive members.

* * * * *